US012801009B2

(12) United States Patent
Sun

(10) Patent No.: US 12,801,009 B2
(45) Date of Patent: Nov. 17, 2026

(54) OPTICAL DEVICE FABRICATION METHOD

(71) Applicant: Shphotonics Ltd, Suzhou (CN)

(72) Inventor: Lei Sun, Suzhou (CN)

(73) Assignee: Shphotonics Ltd, Suzhou (CN)

( * ) Notice: Subject to any disclaimer, the term of this patent is extended or adjusted under 35 U.S.C. 154(b) by 766 days.

(21) Appl. No.: 18/316,885

(22) Filed: May 12, 2023

(65) Prior Publication Data

US 2023/0367202 A1 Nov. 16, 2023

(30) Foreign Application Priority Data

May 16, 2022 (CN) ......................... 202210529439.8

(51) Int. Cl.
*G03F 1/48* (2012.01)
*B82Y 40/00* (2011.01)
*G03F 1/60* (2012.01)
*G03F 1/80* (2012.01)

(52) U.S. Cl.
CPC ................ *G03F 1/48* (2013.01); *B82Y 40/00* (2013.01); *G03F 1/60* (2013.01); *G03F 1/80* (2013.01)

(58) Field of Classification Search
CPC .............. G03F 1/48; G03F 1/60; B82Y 40/00
See application file for complete search history.

(56) References Cited

U.S. PATENT DOCUMENTS 8,148,264 B2 * 4/2012 Henry ................. B81C 1/00111 438/668

FOREIGN PATENT DOCUMENTS

CN 101369618 A * 2/2009
CN 108025909 A * 5/2018 ............. H10F 99/00

* cited by examiner

*Primary Examiner* — Lucy P Chien
(74) *Attorney, Agent, or Firm* — ANOVA LAW GROUP, PLLC

(57) ABSTRACT

An optical device fabrication method includes: coating a first material over a surface of a substrate; etching a portion of the first material to obtain a target position for a nano-pillar; coating a second material over a portion of the surface of the substrate exposed through etching the portion of the first material, a height of the second material being equal to a height of the first material; coating a nano-material over a surface of the second material and the first material; etching the nano-material to remove a first portion of the nano-material and retain a second portion of the nano-material at the target position to form a part of the nano-pillar, a ratio of a height of the nano-pillar to a width of the nano-pillar ≥10; and filling a protective material in a space previously occupied by the first portion of the nano-material to support the nano-pillar.

15 Claims, 3 Drawing Sheets

200

OPTICAL DEVICE FABRICATION METHOD

CROSS-REFERENCE TO RELATED APPLICATION

This application claims priority to Chinese Application No. 202210529439.8, filed on May 16, 2022, the entire content of which is incorporated herein by reference.

TECHNICAL FIELD

The present disclosure relates to the technical field of semiconductors and, in particular, to an optical device fabrication method.

BACKGROUND

A metasurface device often includes a substrate and a plurality of nano-pillars on a surface of the substrate. Through use of different materials, different structures, and/or different arrangements among the plurality of nano-pillars, various optical functions such as chromatic aberration adjustment, imaging, and spectral modulation can be achieved. Thus, metasurface device is often used in display devices and optical computing devices.

A metasurface device may be affected by structural diffraction dispersion. "Diffraction dispersion" refers to a dispersion phenomenon due to different diffraction directions of light of different wavelengths passing through the metasurface device. To address the diffraction dispersion issue, a conventional approach is to make the nano-pillars on a surface of the metasurface device taller to reduce the diffraction dispersion of incident light and achieve more complex optical functions.

However, making the nano-pillars taller without also widening the nano-pillars may result in a substantially large aspect ratio of the nano-pillars (that is, a ratio of a height of a nano-pillar to a width of the nano-pillar). It is difficult to fabricate nano-pillars with substantially large aspect ratio. In addition, the nano-pillars with the substantially large aspect ratio are likely to bend down or topple over, which makes the metasurface device less useful.

SUMMARY

One aspect of the present disclosure provides an optical device fabrication method. The fabrication method includes: coating a first material over a surface of a substrate; etching a portion of the first material to obtain a target position for a nano-pillar; coating a second material over a portion of the surface of the substrate exposed through etching the portion of the first material, a height of the second material being equal to a height of the first material; coating a nano-material over a surface of the second material and the first material; etching the nano-material to remove a first portion of the nano-material and retain a second portion of the nano-material at the target position to form a part of the nano-pillar, a ratio of a height of the nano-pillar to a width of the nano-pillar being greater than or equal to 10; and filling a protective material in a space previously occupied by the first portion of the nano-material to support the nano-pillar.

BRIEF DESCRIPTION OF THE DRAWINGS

To more clearly illustrate the technical solution of the present disclosure, the accompanying drawings used in the description of the disclosed embodiments are briefly described below. The drawings described below are merely some embodiments of the present disclosure. Other drawings may be derived from such drawings by a person with ordinary skill in the art without creative efforts and may be encompassed in the present disclosure.

DETAILED DESCRIPTION OF THE EMBODIMENTS

Figure 1:
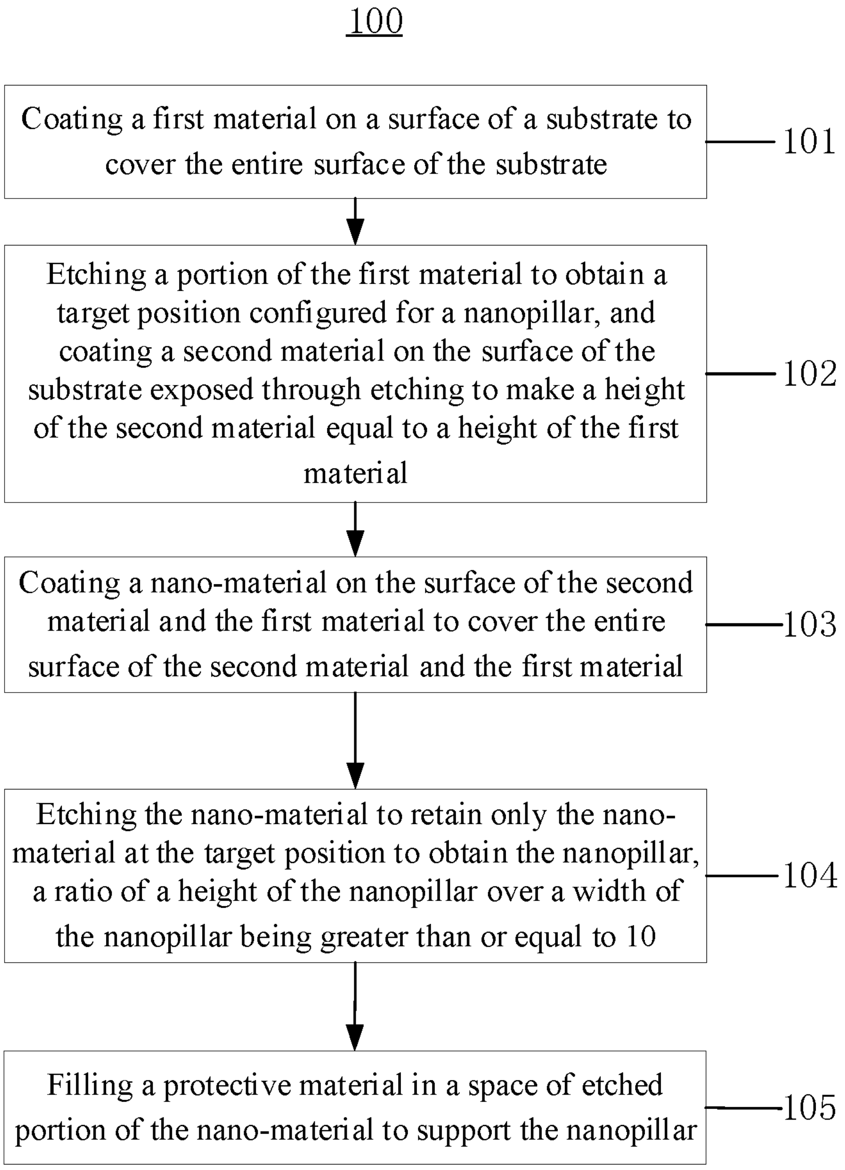
FIG. 1 is a flowchart of an exemplary fabrication method of an optical device based on high aspect ratio nano-pillars according to some embodiments of the present disclosure.

In the following, some example embodiments are described. As those skilled in the art would recognize, the described embodiments can be modified in various different manners, all without departing from the spirit or scope of the present disclosure. Accordingly, the drawings and descriptions are illustrative in nature and not limiting.

In the present disclosure, terms such as "first," "second," and "third" can be used to describe various elements, components, regions, layers, and/or parts. However, these elements, components, regions, layers, and/or parts should not be limited by these terms. These terms are only used to distinguish one element, component, region, layer, or part from another element, component, region, layer, or layer. Therefore, a first element, component, region, layer, or part discussed below can also be referred to as a second element, component, region, layer, or part, which does not constitute a departure from the teachings of the present disclosure.

A term specifying a relative spatial relationship, such as "below," "beneath," "lower," "under," "above," or "higher," can be used in the disclosure to describe the relationship of one or more elements or features relative to other one or more elements or features as illustrated in the drawings. These relative spatial terms are intended to also encompass different orientations of the device in use or operation in addition to the orientation shown in the drawings. For example, if the device in a drawing is turned over, an element described as "beneath," "below," or "under" another element or feature would then be "above" the other element or feature. Therefore, an example term such as "beneath" or "under" can encompass both above and below. Further, a term such as "before," "in front of," "after," or "subsequently" can similarly be used, for example, to indicate the order in which light passes through the elements. A device can be oriented otherwise (e.g., being rotated by 90 degrees or being at another orientation) while the relative spatial terms used herein still apply. In addition, when a layer is referred to as being "between" two layers, it can be the only layer between the two layers, or there can be one or more intervening layers.

Terminology used in the disclosure is for the purpose of describing the embodiments only and is not intended to limit the present disclosure. As used herein, the terms "a," "an," and "the" in the singular form are intended to also include the plural form, unless the context clearly indicates otherwise. Terms such as "comprising" and/or "including" specify the presence of stated features, entities, steps, operations, elements, and/or parts, but do not exclude the existence or addition of one or more other features, integers, steps, operations, elements, parts, and/or combinations thereof. As used herein, the term "and/or" includes any and all combinations of one or more of the listed items. The phrases "at least one of A and B" and "at least one of A or B" mean only A, only B, or both A and B.

When an element or layer is referred to as being "on," "connected to," "coupled to," or "adjacent to" another element or layer, the element or layer can be directly on, directly connected to, directly coupled to, or directly adjacent to the other element or layer, or there can be one or more intervening elements or layers. In contrast, when an element or layer is referred to as being "directly on," "directly connected to," "directly coupled to," or "directly adjacent to" another element or layer, then there is no intervening element or layer. "On" or "directly on" should not be interpreted as requiring that one layer completely covers the underlying layer.

In the disclosure, description is made with reference to schematic illustrations of example embodiments (and intermediate structures). As such, changes of the illustrated shapes, for example, as a result of fabrication techniques and/or tolerances, can be expected. Thus, embodiments of the present disclosure should not be interpreted as being limited to the specific shapes of regions illustrated in the drawings, but are to include deviations in shapes that result, for example, from fabrication. Therefore, the regions illustrated in the drawings are schematic and their shapes are not intended to illustrate the actual shapes of the regions of the device and are not intended to limit the scope of the present disclosure.

Unless otherwise defined, all terms (including technical and scientific terms) used herein have the same meaning as commonly understood by those of ordinary skill in the art to which this disclosure belongs. Terms such as those defined in commonly used dictionaries should be interpreted to have meanings consistent with their meanings in the relevant field and/or in the context of this disclosure, unless expressly defined otherwise herein.

As used herein, the term "substrate" can refer to the substrate of a diced wafer, or the substrate of an un-diced wafer. Similarly, the terms "chip" and "die" can be used interchangeably, unless such interchange would cause conflict. The term "layer" can include a thin film, and should not be interpreted to indicate a vertical or horizontal thickness, unless otherwise specified.

The present disclosure provides a fabrication method of an optical device based on high aspect ratio nano-pillars. The high aspect ratio nano-pillars fabricated by the method provided by the present disclosure are unlikely to bend down.

The fabrication method of the optical device based on the high aspect ratio nano-pillars will be described in detail below through various embodiments.

FIG. 1 is a flowchart of an exemplary fabrication method 100 of an optical device based on high aspect ratio nano-pillars according to some embodiments of the present disclosure. The fabrication method 100 will also be referred to as the method 100 in this specification. For any one of the nano-pillars of the optical device, the method 100 includes the following processes.

At 101, a first material is coated over a surface of a substrate to cover the entire surface of the substrate.

At 102, a portion of the first material is etched to obtain a target position for a nano-pillar to be formed, and a second material is coated over a portion of the surface of the substrate exposed through etching the first material to cause a height of the second material to be equal to a height of the first material.

In some embodiments, the first material is a nano-material, and the second material is a protective material. In this scenario, the remaining portion of the first material is located at the target position and forms a first portion of the nano-pillar. In some other embodiments, the first material is a protective material, and the second material is a nano-material. In this scenario, the etched portion of the first material was located at the target position and etched away to leave a space at the target position for the second material to fill in, where the second material filled in this space at the target position forms the first portion of the nano-pillar.

At 103, a nano-material is coated over a surface of the second material and the first material to cover the entire surface of the second material and the first material. The surface of the second material and the first material refers to a surface formed by a surface of the second material and a surface of the first material.

At 104, the nano-material is etched to retain a portion of the nano-material at the target position to form a second portion of the nano-pillar. The first portion and the second portion together constitute the nano-pillar, and a ratio of a height of the nano-pillar to a width of the nano-pillar is greater than or equal to 10.

At 105, a protective material is coated in a space of etched portion of the nano-material to support the nano-pillar. That is, the protective material is formed at a place where the etched portion of the nano-material was.

For a better understanding of the disclosure, the method 100 will be described in detail below in connection with some examples.

Figure 2:
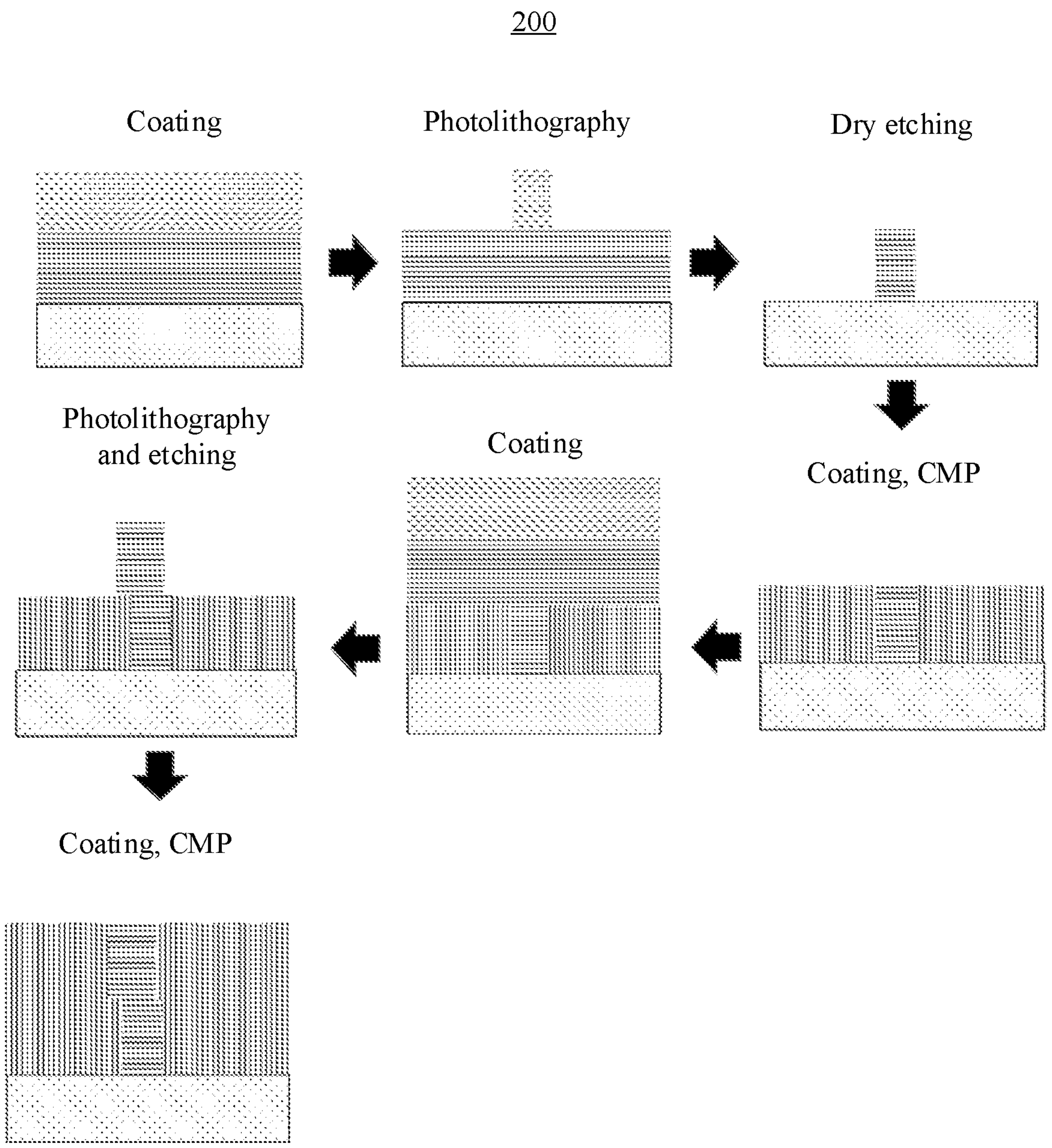
FIG. 2 shows a process flow of an exemplary fabrication method of an optical device based on high aspect ratio nano-pillars according to some embodiments of the present disclosure.

FIG. 2 shows a process flow of an exemplary fabrication method 200 of an optical device based on high aspect ratio nano-pillars according to some embodiments of the present disclosure. The fabrication method 200 will also be referred to as the method 200 in this specification. The method 200 may be, for example, an embodiment of the method 100 where the first material is a nano-material.

As shown in FIG. 2, a first nano-material is coated over a surface of a substrate to cover the entire surface of the substrate.

Then, a portion of the first nano-material is etched to expose a portion of the surface of the substrate. A position where a remaining portion of the first nano-material is located is a target position. The remaining portion of the first nano-material forms a first part of the nano-pillar.

Then, a first protective material is coated over the portion of the surface of the substrate exposed through etching, such that a height of the first protective material is equal to a height of the first nano-material.

Then, a second nano-material is coated over a surface of the first nano-material and the first protective material to cover the entire surface of the first nano-material and the first protective material. The surface of the first nano-material and the first protective material refers to a surface formed by a surface of the first nano-material and a surface of the first protective material.

Then, the second nano-material located outside the target position is etched to expose a portion of the surface of the first nano-material and the first protective material. The second nano-material remained at the target position forms a second part of the nano-pillar.

Then, a second protective material is coated in a space of the etched portion of the second nano-material to support the nano-pillar.

In the embodiments of the present disclosure, as shown in FIG. 2, the first nano-material is coated over the surface of the substrate to cover the entire surface of the substrate. A photoresist is coated over the surface of the first nano-material, and a photolithography process is performed according to a preset position of the nano-pillar, such that only the photoresist at the preset position remains. The first nano-material is etched according to the position of the photoresist, and remaining portion of the first nano-material forms the first part of the nano-pillar. At the same time, the position of the remaining portion of the first nano-material is the target position of the nano-pillar. The first protective material is coated over the exposed surface of the substrate, and chemical mechanical polishing and etching processes are performed to make the height of the first protective material equal to the height of the first nano-material (i.e., the first part of the nano-pillar). Then, the second nano-material is coated over the surface of the first nano-material and the first protective material. Photoresist is coated over the surface of the second nano-material. An etching process is performed according to the target position of the nano-pillar to retain a portion of the second nano-material at the target position as the second part of the nano-pillar. Then, the second protective material is coated over the surface of the first nano-material and the first protective material to support the nano-pillar and prevent the nano-pillar from bending down. The photoresist may be replaced by a combination of photoresist, a transmittance enhancement layer (e.g., an anti-reflection layer), and a hard mask material, which can also be used to transfer the photolithography pattern to the nano-material layer.

In some embodiments, the nano-pillar with the high aspect ratio is divided into two parts which are fabricated separately, the fabrication process is simplified, and the nano-pillar with the high aspect ratio can be fabricated in its entirety. At the same time, the protective material is filled to prevent the nano-pillar from bending down.

The fabrication method shown in FIG. 2 is merely intended to be exemplary, and does not constitute a limitation to the fabrication method of the optical device based on the high aspect ratio nano-pillar of the embodiments of the present disclosure. In some other embodiments, the present disclosure also provides other technical solutions.

Figure 3:
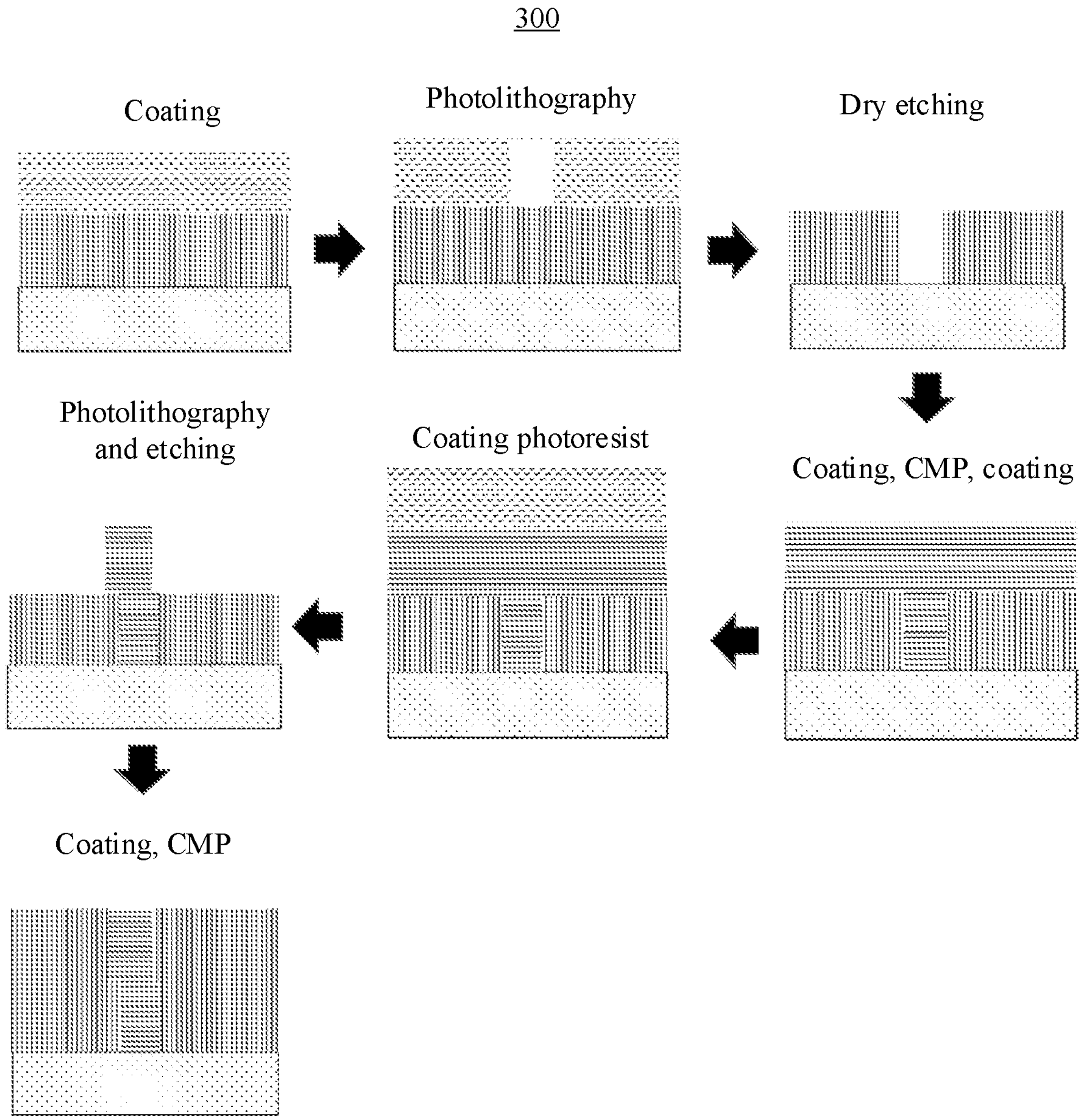
FIG. 3 shows a process flow of another exemplary fabrication method of an optical device based on high aspect ratio nano-pillars according to some embodiments of the present disclosure.

FIG. 3 shows a process flow of another exemplary fabrication method 300 of an optical device based on high aspect ratio nano-pillars according to some embodiments of the present disclosure. The fabrication method 300 will also be referred to as the method 300 in this specification. The method 300 may be, for example, an embodiment of the method 100 where the first material is protective material.

As shown in FIG. 3, a first protective material is coated over a surface of a substrate to cover the entire surface of the substrate.

Then, a portion of the first protective material is etched to expose a portion of the surface of the substrate, to obtain a columnar space. A position of the columnar space is a target position.

Then, a first nano-material is coated in the columnar space to occupy the entire columnar space. The first nano-material filled in the columnar space forms a first part of the nano-pillar. Chemical mechanical polishing and etching processes are performed to make a height of the first protective material equal to a height of the first nano-material.

Then, a second nano-material is coated over a surface of the first nano-material and the first protective material to cover the entire surface of the first nano-material and the first protective material.

Then, a portion of the second nano-material located outside the target position is etched to expose a portion of the surface of the first nano-material and the first protective material. A remaining portion of the second nano-material at the target position forms a second part of the nano-pillar.

Then, a second protective material is coated in a space of the etched portion of the second nano-material to support the nano-pillar.

In the embodiments of the present disclosure, as shown in FIG. 3, the first protective material is coated over the surface of the substrate to cover the entire surface of the substrate. A photoresist is coated over the surface of the first protective material and a photolithography process is performed on the photoresist according to a preset position of the nano-pillar. The first protective material is etched according to the preset position of the nano-pillar to obtain the columnar space at the target position of the nano-pillar. The columnar space is filled with the first nano-material to occupy the entire columnar space without gaps. The first nano-material filled in the columnar space forms the first part of the nano-pillar. Chemical mechanical polishing and etching processes are performed to make the height of the first protective material equal to the height of the first nano-material. Then, the second nano-material is coated over the surface of the first nano-material and the first protective material. A photoresist is coated over the surface of the second nano-material, and the photoresist is etched according to the target position of the nano-pillar. The remaining portion of the second nano-material forms the second part of the nano-pillar. The first part and the second part are connected to form the nano-pillar. Then, the second protective material is coated over the surface of the first nano-material and the first protective material to support the nano-pillar.

In some other embodiments, the first nano-material and the second nano-material are the same material, the chemical mechanical polishing and etching processes after coating the first nano-material can be omitted and the nano-material can be filled in the columnar space and over the surface of the first protective material. This simplifies the fabrication processes and can also fabricate the nano-pillar with the high aspect ratio. At the same time, mechanical stability of the nano-pillar is ensured, and the protective material support is provided to prevent the nano-pillar from bending down.

It should be understood that the method 300 is only a schematic description of the embodiment of the present disclosure, and does not constitute a limitation to the embodiment of the present disclosure. In some other embodiments, other fabrication methods are also possible.

In some embodiments, the first part of the nano-pillar and the second part of the nano-pillar are stacked in a direction perpendicular to the surface of the substrate. In some other embodiments, the first part and the second part are not stacked.

In some embodiments, projections of the first part of the nano-pillar and the second part of the nano-pillar in the direction perpendicular to the surface of the substrate coincide with each other. That is, an upper end of the first part of the nano-pillar is connected to a lower end of the second part of the nano-pillar to form the entire nano-pillar. In some other embodiments, the projections of the first part and the second part in the direction perpendicular to the surface of the substrate do not completely coincide with each other.

In some embodiments, the nano-material of the first part of the nano-pillar is different from the nano-material of the second part of the nano-pillar. In some other embodiments, the optical device includes a plurality of nano-pillars and the nano-materials of the plurality of nano-pillars are not completely the same, i.e., the nano-material of some nano-pillars is different from the nano-material of some other nano-pillars.

In some embodiments, the nano-material of the first part of the nano-pillar and the nano-material of the second part of the nano-pillar may be the same or different. That is, the first nano-material and the second nano-material may be the same or different. When the first nano-material and the second nano-material are the same, as shown in FIG. 2 and FIG. 3, the entire nano-pillar includes the same material. In some other embodiments, the nano-materials included in the plurality of nano-pillars in the optical device may be different. That is, the nano-materials of different nano-pillars are different. Of course, the first part of the nano-material and the second part of the nano-material may be different according to different functions of the nano-pillar design to satisfy optical function requirements of the optical device. In this case, an anti-reflection coating may be coated at an interface between two nano-materials to increase mechanical stability of a connection between the first part and the second part.

In some embodiments, the protective material coated over the surface of the substrate may be different from the protective material coated over the surface of the second material and the first material. In some other embodiments, the protective materials around different nano-pillars in the optical device may be different.

In some embodiments, the protective material coated over the surface of the substrate and the protective material coated over the surface of the second material and the first material may be the same or different. The protective material coated over the surface of the substrate is the first protective material, and the protective material coated over the surface of the first protective material and the first nano-material is the second protective material. When the first protective material and the second protective material are the same, as shown in FIG. 2 and FIG. 3, two layers of the protective materials around the same nano-pillar are the same material, and the protective materials between the plurality of nano-pillars in the optical device are different. Alternatively, the protective material around the nano-pillar includes two types, that is, the first protective material and the second protective material are different. Because different types of materials have different effects on optical processing, the protective material may be selected according to the desired function of the optical device.

In some embodiments, the ratio of the height of the nano-pillar to the width of the nano-pillar is greater than or equal to 10. A sum of the height of the first part of the nano-pillar and the height of the second part of the nano-pillar can be the height of the nano-pillar. A diameter of the columnar space or the width of the nano-material retained on the surface of the substrate can be the width of the nano-pillar. The ratio of the height of the nano-pillar to the width of the nano-pillar is greater than or equal to 10.

In some embodiments, the nano-pillar includes the first part and the second part. The first part and the second part may have different widths, and may have different heights. The sum of the heights of the first part and the second part can be the overall height of the nano-pillar. The smaller of the width of the first part and the width of the second part, or the width of the first part, can be the width of the entire nano-pillar. The ratio of the height of the nano-pillar to the width of the nano-pillar is greater than or equal to 10. The plurality of nano-pillars that satisfy the aspect ratio requirement may be used to form the optical device. Such optical device is able to perform more complex optical functions.

Different nano-pillars may have the same total height, or different total heights. That is, between different layers, structural patterns of the nano-pillars may be different, and there may or may not be nano-pillars at the same position. Nano-pillars may also have shapes and combinations of the shapes such as circles, ellipses, rectangles, squares, and polygons.

Although a two-layer structure is described in the above embodiments, a multi-layer structure may be used in actual use.

Because of an overlay accuracy problem in the semiconductor processes, there may be a horizontal relative displacement between the first part and the second part in actual fabrication process, as shown in FIG. 2 and FIG. 3.

In the embodiments of the present disclosure, the fabrication method of the optical device based on the high aspect ratio nano-pillars increases the height of the nano-pillars by constructing two layers or two parts of the nano-pillar, which increases the aspect ratio of the nano-pillar while keeping the width unchanged. In addition, the protective material is filled around the nano-pillar to support the nano-pillar, which effectively solves the problem of the nano-pillar bending down.

While various embodiments of the present disclosure have been described, additional changes and modifications to these embodiments may be made by those skilled in the art once the basic inventive concept is appreciated. Therefore, the appended claims are intended to be construed to cover the preferred embodiments and all changes and modifications which fall within the scope of the present disclosure.

The specific implementation manners described above have further described the purpose, technical solutions, and beneficial effects of the application in detail. It should be understood that the above descriptions are merely intended to be exemplary and are not intended to limit the scope of the present disclosure. Protection scope, any modification, equivalent replacement, improvement, etc. made on the basis of the technical solution of the present disclosure shall be included in the protection scope of the present invention.

What is claimed is:

1. An optical device fabrication method comprising:

coating a first material over a surface of a substrate;

etching a portion of the first material to obtain a target position for a nano-pillar;

coating a second material over a portion of the surface of the substrate exposed through etching the portion of the first material, a height of the second material being equal to a height of the first material;

coating a nano-material over a surface of the second material and the first material;

etching the nano-material to remove a first portion of the nano-material and retain a second portion of the nano-material at the target position to form a part of the nano-pillar, a ratio of a height of the nano-pillar to a width of the nano-pillar being greater than or equal to 10; and filling a protective material in a space previously occupied by the first portion of the nano-material to support the nano-pillar.

2. The fabrication method of claim 1, wherein:

one of the first material and the second material is a first nano-material, and another one of the first material and the second material is a first protective material;

etching the portion of the first material and coating the second material form a first part of the nano-pillar;

the nano-material coated over the surface of the first protective material and the first nano-material is a second nano-material, and the protective material filled in the space previously occupied by the first portion of the second nano-material is a second protective material; and the second portion of the second nano-material is a second part of the nano-pillar.

3. The fabrication method of claim 2, wherein:

the first material is the first nano-material, and the second material is the first protective material.

4. The fabrication method of claim 3, wherein:

etching the portion of the first nano-material to obtain the target position includes:

etching the portion of the first nano-material to expose the portion of the surface of the substrate, a position where a retained portion of the first nano-material is located being the target position, and the retained portion of the first nano-material being the first part of the nano-pillar; and coating the first protective material over the portion of the surface of the substrate includes:

coating the first protective material over the portion of the surface of the substrate and a surface of the first nano-material; and performing chemical mechanical polishing and etching to make a height of the first protective material equal to a height of the first nano-material.

5. The fabrication method of claim 2, wherein:

the first material is the first protective material, and the second material is the first nano-material.

6. The fabrication method of claim 5, wherein:

etching the portion of the first protective material to obtain the target position includes:

etching the portion of the first protective material to expose the portion of the surface of the substrate to obtain a columnar space, a position where the columnar space is located being the target position; and coating the first nano-material over the portion of the surface of the substrate includes:

filling the first nano-material into the columnar space and over the first protective material, a portion of the first nano-material filled in the columnar space being the first part of the nano-pillar; and performing chemical mechanical polishing and etching to make a height of the first nano-material equal to a height of the first protective material.

7. The fabrication method of claim 2, wherein:

etching the second nano-material to remove the first portion of the second nano-material and retain the second portion of the second nano-material includes etching the second nano-material outside the target position to expose a portion of the surface of the first nano-material and the first protective material, a remaining portion of the second nano-material being the second portion of the second nano-material at the target position.

8. The fabrication method of claim 7, wherein:

projections of the first part of the nano-pillar and the second part of the nano-pillar in a direction perpendicular to the surface of the substrate coincide with each other.

9. The fabrication method of claim 7, wherein:

the first nano-material and the second nano-material are different nano-materials.

10. The fabrication method of claim 7, wherein:

the first protective material and the second protective material are different protective materials.

11. The fabrication method of claim 2, wherein:

the height of the nano-pillar is a sum of a height of the first part of the nano-pillar and a height of the second part of the nano-pillar; and the width of the nano-pillar is a width of the first part of the nano-pillar.

12. The fabrication method of claim 1, wherein:

the nano-pillar is one of a plurality of nano-pillars of an optical device; and a material of a first one of the plurality of nano-pillars is different from a material of a second one of the plurality of nano-pillars.

13. The fabrication method of claim 1, wherein:

the nano-pillar is one of a plurality of nano-pillars of an optical device; and the protective material surrounding a first one of the plurality of nano-pillars is different from the protective material surrounding a second one of the plurality of nano-pillars.

14. The fabrication method of claim 1, wherein:

the nano-pillar is one of a plurality of nano-pillars of an optical device; and the height of a first one of the plurality of nano-pillars is different from the height of a second one of the plurality of nano-pillars.

15. The fabrication method of claim 1, wherein:

the nano-pillar is one of a plurality of nano-pillars of an optical device; and the width of a first one of the plurality of nano-pillars is different from the width of a second one of the plurality of nano-pillars.

* * * * *